United States Patent [19]

Nishizawa

[11] Patent Number: 4,663,652

[45] Date of Patent: May 5, 1987

[54] PACKAGE FOR OPTICAL DEVICE

[75] Inventor: Hideaki Nishizawa, Osaka, Japan

[73] Assignee: Sumotomo Electric Industries, Ltd., Osaka, Japan

[21] Appl. No.: 671,783

[22] Filed: Nov. 15, 1984

[30] Foreign Application Priority Data

Nov. 21, 1983 [JP] Japan .................................. 58-218964
Nov. 25, 1983 [JP] Japan .................................. 58-223020
Dec. 8, 1983 [JP] Japan .................................. 58-232341

[51] Int. Cl.$^4$ ............................................. H01L 29/44
[52] U.S. Cl. .................................... 357/74; 350/96.20;
                                                     357/68; 357/80
[58] Field of Search ...................... 357/67, 68, 30, 80,
                                                     357/74; 350/96.20

[56] References Cited

U.S. PATENT DOCUMENTS

| 3,959,522 | 5/1976 | Ladany et al. ........................ 357/67 |
| 4,355,321 | 10/1982 | Yeats .................................. 350/96.14 |
| 4,445,130 | 4/1984 | Poulain et al. ....................... 357/68 |

FOREIGN PATENT DOCUMENTS

| 0017701 | 10/1980 | European Pat. Off. . |
| 0089044 | 9/1983 | European Pat. Off. . |
| 2428328 | 1/1980 | France . |
| 0013963 | 1/1980 | Japan ................................. 357/74 |
| 0060037 | 5/1981 | Japan ................................. 357/74 |
| 0091644 | 5/1983 | Japan ................................. 357/74 |
| 0128762 | 8/1983 | Japan ................................. 357/30 |

OTHER PUBLICATIONS

Yeat, R., *Proceedings, Society of Photo-Optical Instruments Engineers (U.S.A.)*, "Long Wavelength Detectors for Optical Fiber Communications," vol. 272, pp. 22–26, (1981).
A. R. Clawson et al, Appl. Phys. Lett., vol. 32, (No. 9), p. 549, (1978).
Gendai Kogaku Sha, Basic Principle of Super LSI Electronics, vol. II, pp. 198–219, Original Title, "VLSI Electronics: Microstructure Science, Academic Press".
Shinko Denki Kogyo K.K. Catalog, "Optical Header Cap".
Patent Abstracts of Japan, Apr. 5, 1980.

*Primary Examiner*—John Lee
*Attorney, Agent, or Firm*—Cushman, Darby & Cushman

[57] ABSTRACT

In the package for optical device according to the present invention, since electroconductive paste printed on a sapphire substrate cut lower in the central portion beforehand is prevented from rising higher at ends than in other portion after burning, irregularity on the surface of a die bonding pad is eliminated. In the optical device according to the present invention, since an electrode and a solder layer having each a light introducing hole are sequentially mounted in layers on the die-bonded side of an optical device chip which is die-bonded to the die bonding pad by said solder layer, the optical device chip is die-bonded in a stable state.

4 Claims, 29 Drawing Figures

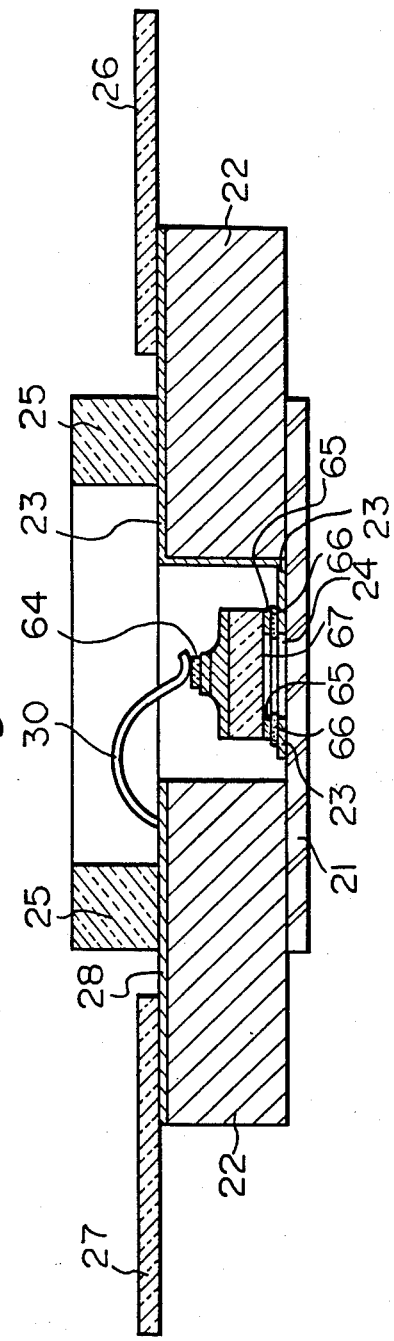
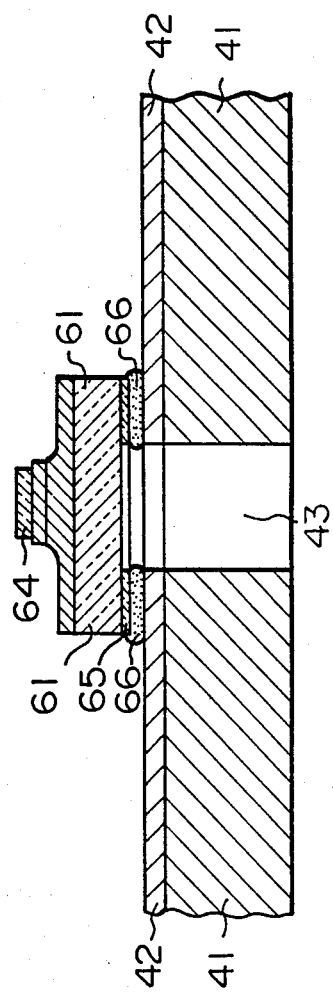
Fig. 28
Fig. 29

PACKAGE FOR OPTICAL DEVICE

FIELD OF THE INVENTION

The present invention relates to optical devices such as light-emitting diodes and photodiodes, a method for producing them, and packages for such optical devices.

BACKGROUND OF THE INVENTION

In an optical device such as a light emitting device or a light receiving device, and a package for such optical device, there have been the following technological requirements:

(a) It must have a light introducing structure which is transparent to light;

(b) It must be wired as by die bonding or wire bonding to lead electrode terminals in and out of it;

(c) Its chip must be sealed hermetically; and (d) It must have a high coupling efficiency with an optical fiber. That is, a light emitting diode chip or a photodiode chip must be sufficiently close to the optical fiber in end faces and must have a large opening angle. Further, the chip must have a clean light receiving surface which is not stained with paste or like material.

The present invention intends to meet all these criteria, particularly the requirement (d) above.

Prior Art I

Upper Surface Type

FIG. 1 is a sectional view of a prior art package for a photodiode. This package is a most common type in which light of an optical fiber is incident to it through the upper surface of it. In FIG. 1, a T018 type package 1 comprises a package body 2 and a cap 3 to cover the upper surface of the body 2. The cap 3 has an opening at the center of the top thereof, which has a transparent kovar glass therein to serve as a window 4. A photo diode chip 5 is die-bonded to the top plate of the package body 2. The top plate of the package body 2 is provided with a lead 6. Another lead 7 and an electrode on the photodiode chip 5 are wire-bonded with each other by a gold wire 8. An optical fiber 9 is disposed outside of the window 4 in opposition to the photodiode chip 5.

The cap 3 and the body 2 are welded together on sides thereof. This package is of a hermetic seal type which has been yielding satisfactory results for a long time. In this package, since light is incident to it from the upper surface where the wire bonding (gold wire 8) exists, the distance between the upper surface of the photodiode chip 5 and the window 4 is unduly long, resulting in a disadvantage that the coupling efficiency with the optical fiber 9 is low.

FIG. 2 shows another package for an optical device of the upper surface type as shown in FIG. 1, in which a sapphire plate 4' is mounted in the window in place of the transparent copal glass 4. The package shown in FIG. 2 has likewise the disadvantage that the coupling efficiency with the optical fiber 9 is low because the photodiode chip 5 and the sapphire plate 4' are separated from each other by the gold wire 8 wire-bonded to the chip 5.

Prior Art II

Through Hole on Under Surface Type

It is easier to get the optical fiber and the chip close to each other from the under surface than from the upper surface because the wire on the upper surface gives a limit to approach from the upper surface. Therefore, through hole on under surface type packages for optical device shown in FIGS. 3 to 5 have been produced. In FIG. 3, a package 10 comprises a package body 12 and a cap 11. In this example, the cap 11 has no window. The package body 12 is provided with a large through hole 13 defined axially under the photodiode chip 5. An optical fiber 14 is disposed under the through hole 13 having its upper end face opposed to the lower opening of the through hole 13. The light from the optical fiber 14 is incident to the photodiode chip 5 from the under surface thereof through the through hole 13. In FIGS. 3 to 5, designated by numeral 15 are leads equivalent to the leads 6 in FIGS. 1 and 2.

FIG. 4 shows an example of the package in which the through hole 13' is enlarged into which the upper end portion of the optical fiber 14 is inserted and fixed so as to reduce the distance between the photodiode chip 5' and the end of the optical fiber 14. This example has, however, disadvantages that the upper end of the optical fiber 14 inserted into the through hole 13' may come in contact with the photodiode chip 5' and damage it and that fixing of the optical fiber 14 is difficult.

FIG. 5 shows an example of the package in which the through hole 13 is sealed off by a copal glass piece 16.

Disadvantages of these through hole on under surface type packages will be described with reference to enlarged sectional views of FIGS. 6 and 7 taking the case of FIG. 3 as an example.

A pn junction of the photodiode chip 5 behaves as a light receiver 17 to which the light is incident from under through the through hole 13. Since the light is limited by the edge 18 of the through hole 13, only the light within the opening angle $\theta$ reaches the light receiver 17. Even if the end face of the optical fiber 14 is brought in contact with the under surface of the package body 12, it is still limited by the opening angle $\theta$.

Mounting of the photodiode chip 5 is difficult. The through hole 13 is round in section and the photodiode chip 5 is die-bonded to the cap 11 on the contact region 19 exclusive of the through hole 13. Since the chip 5 is small and the through hole 13 is also small in section, alignment of them is difficult. If the center of the light receiver 17 is displaced to a side from the central axis of the through hole 13, as shown in FIG. 7, the quantity of light received by the light receiver 17 is smaller on the side to which it is displaced than on the other side. In FIG. 7, the chip 5 is displaced to the right side and, accordingly, a smaller quantity of light reaches the right half of the light receiver 17 than the left half thereof. Reduction in the quantity of the light incident to the photodiode decreases the detection sensitivity.

In order to enlarge the opening angle of the light incident to the light receiver 17, the through hole 13 must be reduced in length and increased in sectional area. The length of the through hole 13 is equal to the thickness of the package body 12. Reduction in thickness of the package body 12 thus make the mechanical strength of it insufficient. The body 12 is made of metal or ceramic and is limited in thinning because it is the mechanical center to support the chip, lead and cap. A larger diameter of the through hole 13 will necessitate the larger size of the photodiode chip 5, and a larger size of the semiconductor will result in higher cost and lower strength of the chip. Prior Art III Sapphire. Substrate Type Accordingly, the inventors of the present invention has previously invented a package for an optical device, in which a sapphire substrate is provided thereon with a die bonding pad having an opening, an optical device is die-bonded to the pad, and an end of an optical fiber is opposed to the rear side of the sapphire substrate.

FIG. 8 is a plan view of the package for the optical device thus accomplished by the inventors, and FIG. 9 is a sectional view taken along the line IX—IX of FIG. 8. FIG. 10 is a sectional view of the package in which a photodiode chip is die-bonded and a gold wire or the like is wire-bonded. In the structure of the package shown in FIGS. 8 to 10, a lower frame 22 is bonded to a sapphire substrate 21. The lower frame 22 is made of sintered alumina in this example but may be of any insulator. The lower frame 22 is bonded to the sapphire substrate 21 as by brazing. An electroconductive die bonding pad 23 having an opening 24 is disposed at the center of the sapphire substrate 21 by metallizing. The die bonding pad 23 extends at an end thereof beyond an inner edge of the lower frame 22 to an outer edge thereof. The opening 24 is for passing light therethrough. While the opening 24 is shown as round in shape, it may, of course, be of other shape, for example, square. An upper frame 25 is bonded to the lower frame 22. In this example, the upper frame 25 is also made of alumina. The upper frame 25 and the lower frame 22 are bonded together by an insulating bonding agent. A lead 26 is soldered to the extended portion of the die bonding pad 23. A wire bonding pad 28 is metallized to the inner edge of the lower frame 22 opposite to the die bonding pad 23. A lead 27 is soldered to the extended portion of the wire bonding pad 28. An optical device chip 29 such as a photodiode or a light emitting diode is bonded to the package as shown in FIG. 10. The optical device chip 29 is mounted on the die bonding pad 23 in such a way that the opening 24 and the optical device chip 29 are aligned in center with each other. The die bonding pad 23 is a ring solder of, for example, an AuSn eutectic crystal. By applying energy such as ultrasonic wave to the optical device chip 29 which is held down, the solder is melted to fix the chip 29 on the pad 23. Further, a wire 30 of, for example, gold is wire-bonded to connect the wire bonding pad 28 with the electrode of the optical device chip 29. Normally, an alumina cap is bonded to the upper frame 25 to seal off the inner space of the package.

FIG. 11 is an enlarged plan view of a portion of the die bonding pad 23 surrounding the opening 24, and FIG. 12 is a sectional view taken along the line XII—XII of FIG. 11. Ideally, the sapphire substrate 21 and the die bonding pad 23 are both flat as shown in FIG. 12. If the pad 23 is perfectly flat, the optical device chip 29 can be fixed accurately at the predetermined position in a stable state. Actually, however, the die bonding pad 23 is not made perfectly flat for the reason described below.

FIG. 13 is a sectional view of the state in which paste of an electroconductive material (for example, gold or AuSn eutectic crystal) is printed on the sapphire substrate 21. Since it is thick film printing, a thin screen with an opening identical in shape to the pad is placed on the sapphire substrate 21, and gold paste 23 is applied onto the screen. In this state, the applied gold paste 23 is flat in its upper surface. Then, the sapphire substrate 21 is placed in a furnace and burned to solidify the gold paste. In the burning process, the gold paste 23' is caused to rise up at ends 23' a by surface tension. For this reason, the gold paste 23 becomes higher at ends 23'a than in other portions. When removed from the furnace, the gold paste is solidified in this indeterminate shape. FIG. 14 is a sectional view of the pad after the burning process. FIG. 15 is a sectional view of the pad on which the optical device chip 29 is die-bonded. Many depressions and rises are caused on the upper surface of the paste by expansion and contraction of the paste during the burning process. While the depressions and rises on the paste are approximately several $\mu$m in height, since the optical device chip 29 is also small in size, the flat chip tends to be inclined or incomplete in fixing when bonded to the paste having such depressions and rises. Further, the chip is relatively easily detached by a weak shock or vibration.

Prior Art IV

Mesa Type Photo Diode

Another problem is high speed operation of the photodiode. Since the photodiode is used in an inversely, or reverse biased state, the electrostatic capacity in the pn junction obstructs the high speed operation. Reduction in area of the light receiving region (pn junction) is effective to reduce the electrostatic capacity. For this purpose, a mesa structure as shown in FIG. 16 may be used.

A p-InP layer 32 is formed on an n-InP substrate 31 as by epitaxial growth. A narrow pn junction 33 between the substrate 31 and the layer 32 functions as the light receiving region. Further, the p-InP layer 32 and the pn junction 33 are etched off in stripes toward the upper portion of the n-InP substrate 31 on both sides to reduce the area of the light receiving region. Since the p-InP layer 32 is narrowed in stripes, a ring-shaped electrode can no longer be mounted thereon. Accordingly, a stripe-shaped p-type Au-Zn electrode 34 is mounted. Then, the p-layer is obscured for light passage. Instead of it, a ring-shaped n-type AuGeNi electrode 35 is fixed to the bottom of the n-InP substrate 31. Then, the central portion of the bottom of the n-InP substrate 31 serves as a light receiving surface 36 through which the light is made to pass. Therefore, under surface incident types shown in FIGS. 3, 4, 5 and 8 to 12 are demanded also for high speed operation of the photodiode.

A chip 37 of the photodiode described above is made by wafer process in which, after a number of devices are made, a wafer is scribed and divided into chips 37. The chip 37 must be packaged. There is a further problem in mounting the photodiode chip 37 on the pad.

Prior Art V

Ceramic Substrate Type

As an example intermediate between the exaple shown in FIGS. 3 to 5 and the example shown in FIGS. 8 to 12, there is a package using a ceramic substrate having a hole therethrough. Since the ceramic substrate is not conductive, a metal is evaporated thereon to form a die bonding pad which is slightly different in technical meaning from the pad of the example described in the preceding paragraph. Solder is placed on the pad, on which an optical device is placed and soldered.

FIGS. 17 to 21 are sectional views showing in order the steps for assembly of a package of the ceramic substrate type. As shown in FIG. 17, an electroconductive bonding pad 42 is mounted on a ceramic substrate 41 as by evaporation and a light introducing hole 43 is made therethrough. Then, as shown in FIG. 18, a ring solder 44 of Au-Sn is placed around the light introducing hole 43. Thereafter, as shown in FIG. 19, the photodiode chip 37 is placed on the solder 44 and heated in a furnace to solder it.

In this structure, even though the solder 44 and the light introducing hole 43 are aligned with each other correctly, when the chip 37 is soldered, a portion 45 of the solder could overflow from the position to cover the light receiving surface thereby reducing the light receiving area. In many cases, the position of the solder 44 is displaced to a side as shown in FIG. 20. In this case, if the chip 37 is placed and soldered, a wide overflow 45 toward a side could be caused, which would cover the light receiving surface to thereby reduce the sensitivity of the photodiode. While the overflow 45 of the solder can be avoided by reducing the thickness of the solder, the thickness of the solder must be 10 $\mu$m or larger for convenience of handling. For the reason described above, the solder 44 could reduce the light receiving area on the bottom surface of the chip to lower the sensitivity of the photodiode. Another problem is bonding strength. In the case where a ring solder preform (for example, AuSn alloy of 500 $\mu$m outer diameter, 250 $\mu$m inner diameter, and 30 $\mu$m thickness) is used for die bonding there is a time lag between melting of the preform and die bonding of the photodiode, which causes a problem of uneven contact between the bottom surface of the photodiode and the solder 44, resulting in variation in the strength of the die bonding.

SUMMARY OF THE INVENTION

An object of the present invention is to provide a package for an optical device, which is free of a problem in metallizing of a die bonding pad used on a sapphire substrate, that is irregularity caused on the surface of the die bonding pad, and on which an optical device chip can be securely mounted in a stable state.

Another object of the present invention is to provide a package for an optical device, which is free of problems caused in fixing an optical device chip to a die bonding pad such as overflow of solder to the light receiving surface and variation in the strength of the die bond, and on which the optical device chip can be securely die-bonded in a stable state.

A further object of the present invention is to provide a photodiode in which a photo diode chip can be die-bonded to a die bonding pad in a stable state.

In the package for an optical device according to the present invention, in view of the fact that the electroconductive paste printed on the upper surface of the sapphire substrate is caused to rise at ends by burning, the substrate is shaved off beforehand in the central portion in the depth corresponding to the quantity of rising of the burned paste at its ends to make the ends of the burned paste equal in height to other portion of the paste. Accordingly, even when an optical device chip is placed on the die bonding pad formed by the electroconductive paste, the optical device chip is not raised unevenly in the bottom surface.

In the optical device according to the present invention, solder is not applied to the substrate. Instead, an electrode and a solder layer each having a light passing hole therethrough are mounted sequentially to the side of the optical device chip to be die-bonded. Therefore, the optical device chip is die-bonded to the die bonding pad on the substrate by the solder layer on the side of the optical device chip.

BRIEF DESCRIPTION OF THE DRAWINGS

FIG. 28 is a sectional view showing the state in which the mesa type photodiode chip of FIG. 27 is disposed on the sapphire substrate package for optical device; and FIG. 29 is a sectional view showing the state in which the mesa type photodiode chip of FIG. 27 is disposed on the ceramic substrate package for optical device.

PREFERRED EMBODIMENT OF THE INVENTION

Preferred embodiments of the present invention will now be described with reference to the drawings. First of all, an embodiment for overcoming the problem in metallizing the die bonding pad 23 in a package for an optical device shown in FIGS. 8 and 9 will be described with reference to FIGS. 22 to 25. Since the problem in metallizing the die bonding pad is caused by the rising of gold paste at its ends, the sapphire substrate 21 is slightly shaved beforehand to a depth corresponding to the amount of rising of the paste in its ends.

Figure 22:
FIG. 22 is a sectional view of a sapphire substrate.

FIG. 22 is a sectional view of the sapphire substrate 21 which is flat and transparent, and is 0.2 mm in thickness in this example.

Figure 8:
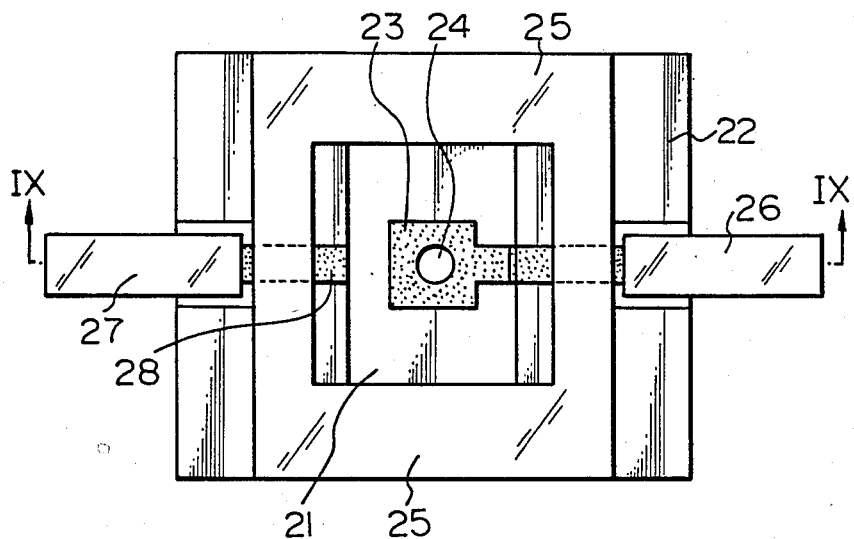
FIG. 8 is a plan view of a package for optical device of a sapphire substrate with a cover removed.
Figure 9:
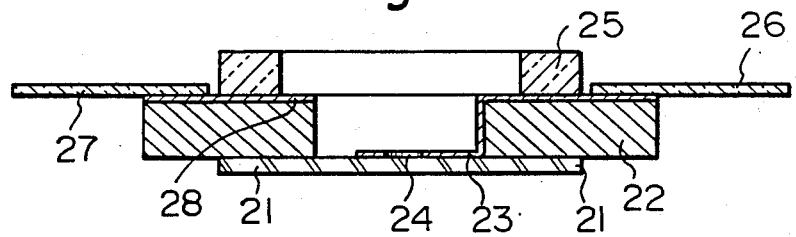
FIG. 9 is a sectional view taken along the line IX—IX of FIG. 8.
Figure 10:
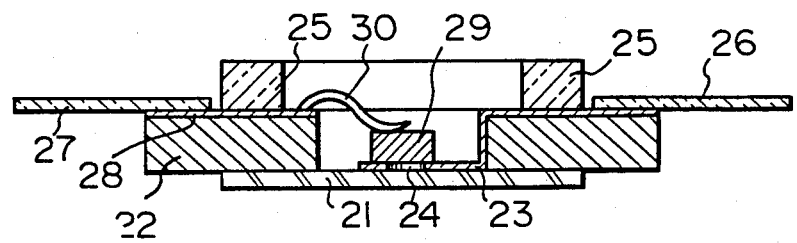
FIG. 10 is a sectional view of the optical device in which the optical device chip is die-bonded to the package of FIG. 9.
Figure 11:
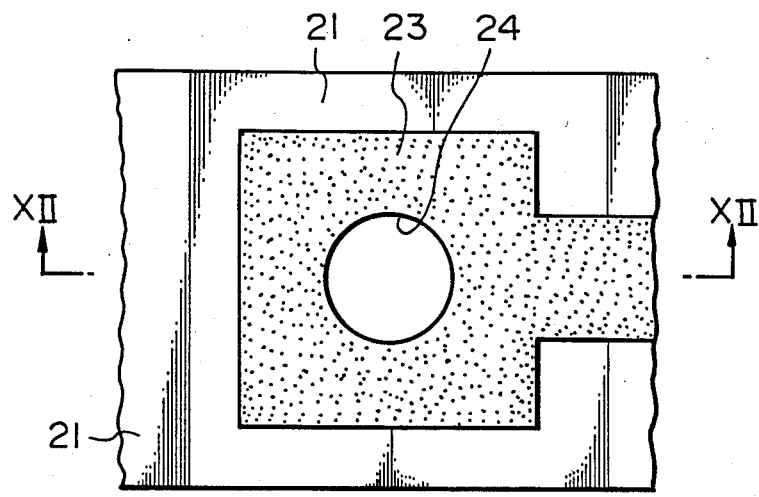
FIG. 11 is an enlarged plan view of an essential portion of the die bonding pad shown in FIGS. 8 and 9.
Figure 12:
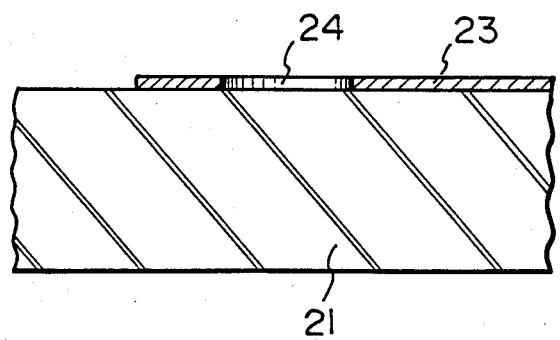
FIG. 12 is a sectional view taken along the line XII—XII of FIG. 11.
Figure 13:
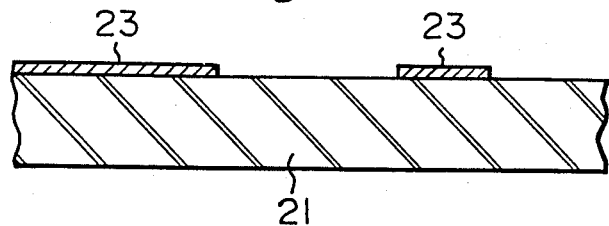
FIG. 13 is a sectional view showing the state in which gold paste is screen-printed on a sapphire substrate.
Figure 14:
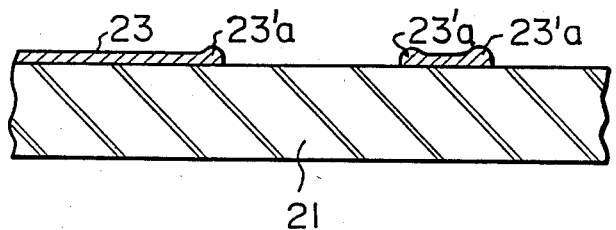
FIG. 14 is a sectional view showing the state of the sapphire substrate with the gold paste thereon burned in a furnace.
Figure 15:
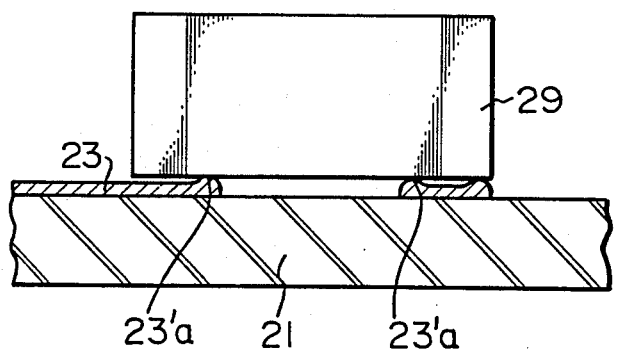
FIG. 15 is a sectional view showing the state in which an optical device chip is placed on the gold paste.
Figure 16:
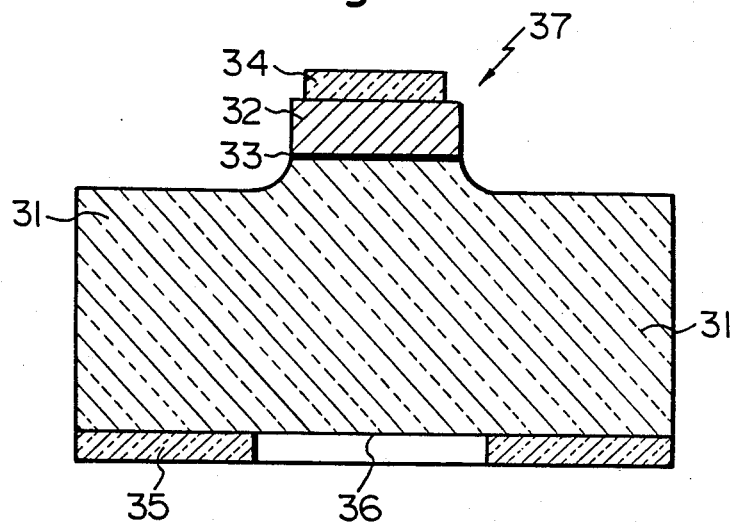
FIG. 16 is a sectional view of an example of a conventional mesa type photodiode chip.
Figure 23:
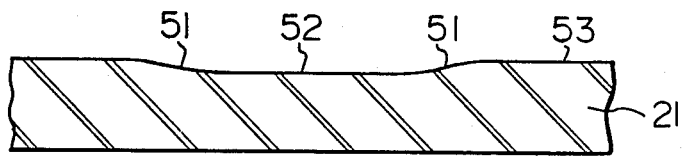
FIG. 23 is a sectional view showing the state in which the sapphire substrate of FIG. 22 is provided with a tapered portion and a concavity.
Figure 24:
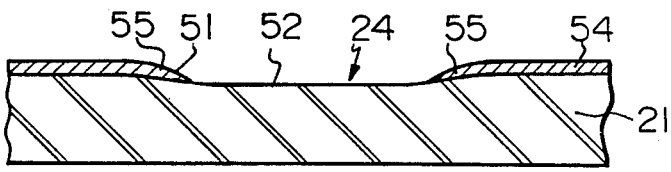
FIG. 24 is a sectional view showing the state in which gold paste is screen-printed on the sapphire substrate in such a manner that ends of the gold paste are positioned on the tapered portion of the substrate.
Figure 25:
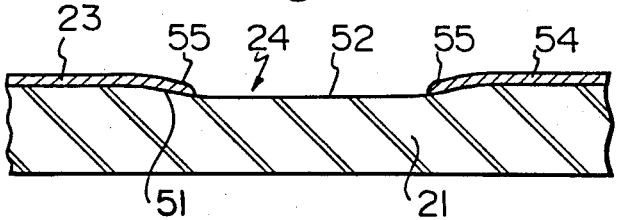
FIG. 25 is a sectional view showing the state in which the sapphire substrate and the gold paste have been burned.

FIG. 23 shows the flat sapphire substrate 21 provided with a shallow tapered portion 51 and a concavity 52 continuous thereto. The tapered portion 51 and the concavity 52 are processed by an Ar laser, but may also be processed mechanically. The difference in height between an unprocessed upper surface 53 and the concavity 52 is in the range 5-10 μm. Then, as shown in FIG. 24, electroconductive paste 54 such as gold paste is screen-printed on the substrate 21 in the shape to be the die bonding pad 23 in such a manner that the concavity 52 corresponds to the opening 24 of the pad 23. Ends 55 of paste 54 corresponding to the opening 24 of the paste 23 are inclined smoothly toward the concavity 52. The screenprinted paste is dried and burned in a furnace. FIG. 25 is a sectional view of the sapphire substrate 21 and the paste 54 thereon after burning. By burning, the paste 54 rises in the ends 55 by a height of no more than 5 μm. Since the ends of the paste extend to the tapered portion 51, the ends of the paste are not made higher than other portions of the paste by the rising. The optical device chip 29 is diebonded to the die bonding pad 23 thus processed. Since the rising in the ends of the paste is levelled off, there is no unequal raising of the bottom surface of the chip 29. Thereafter, a package for optical device as shown in FIGS. 8 and 9 is produced in the process described hereinabove. Then, as shown in FIG. 10, the optical device chip 29 is diebonded, the wire 30 is wire-bonded and cap-sealed to form an optical device.

The package for optical device structured as described above provides the following meritorious technical effects:

(a) Safety in die bonding of the optical device chip is increased. After the gold paste is burned, the rising in the ends is levelled off so that it is not in contact with the surface of the optical device chip. The gold paste is in contact with the back side of the chip only in flat portions thereof to make the entire contact surface flat.

Figure 1:
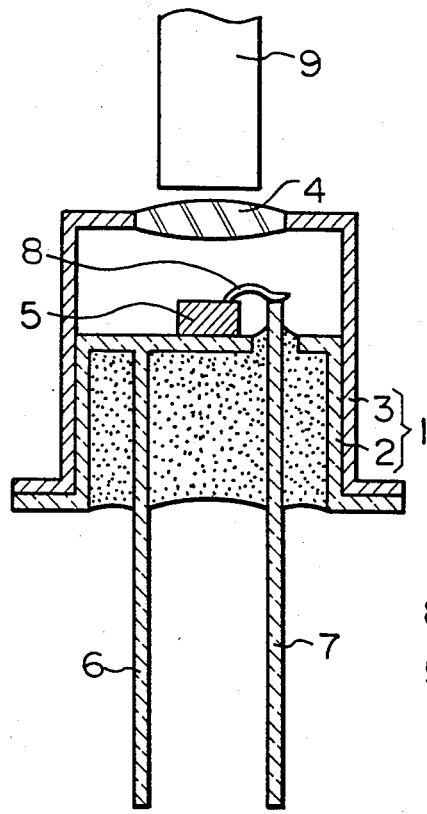
FIG. 1 is a sectional view of a conventional upper surface type package for optical device, having a glass window in the upper surface.
Figure 2:
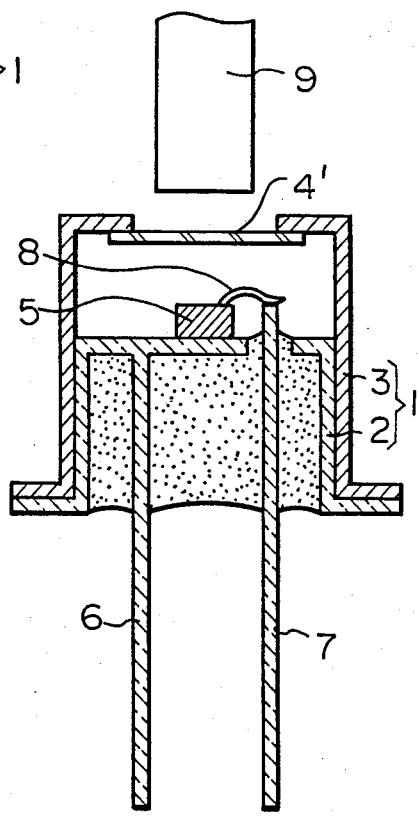
FIG. 2 is a sectional view of a conventional upper surface type package for optical device, having a sapphire window in the upper surface.
Figures 3, 4:
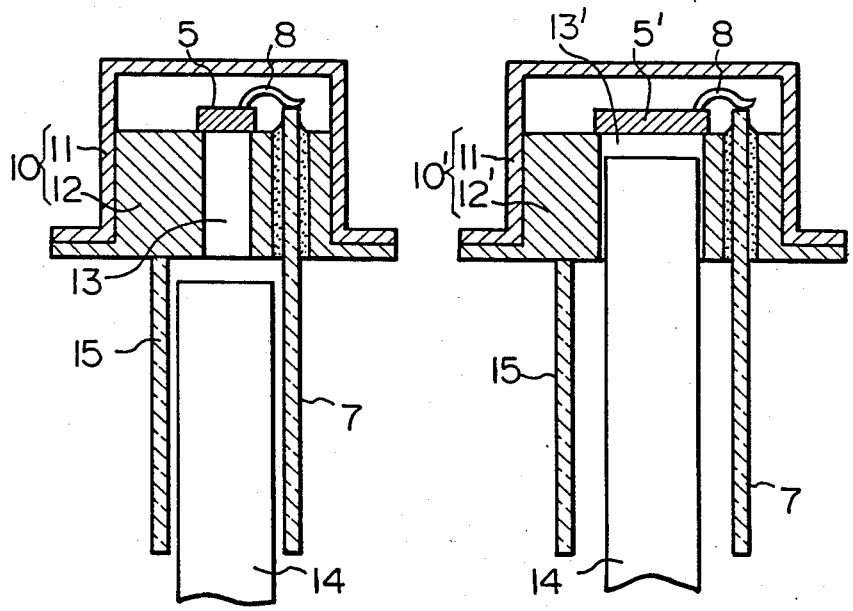
FIGS. 3 to 5 are sectional views of conventional lower surface through hole type packages for optical device.
Figure 5:
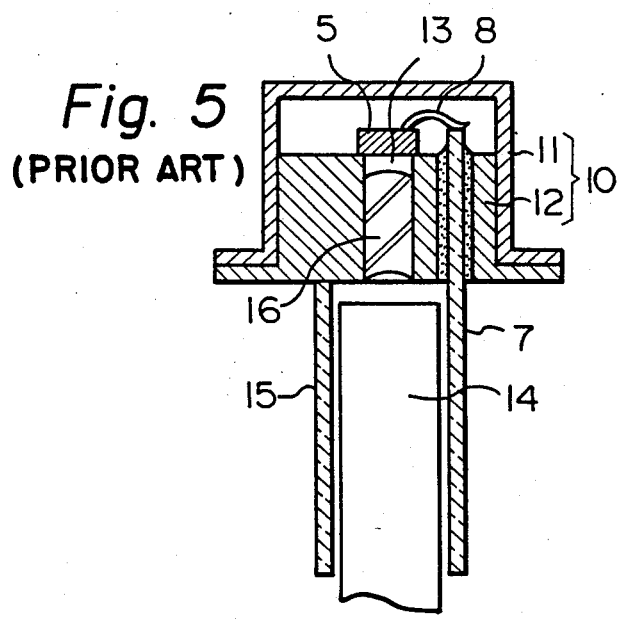
Figure 6:
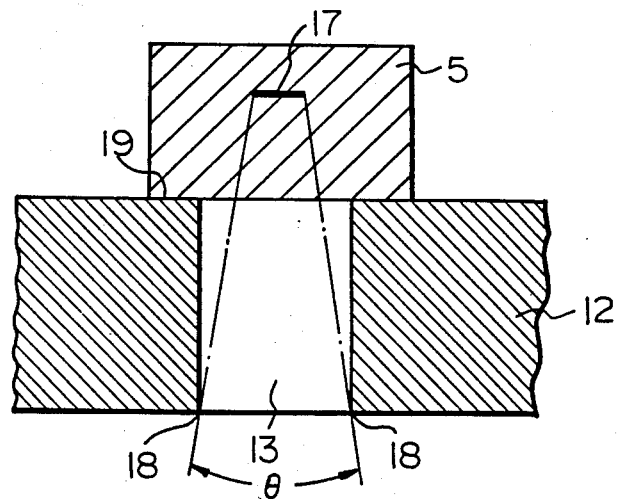
FIG. 6 is an enlarged sectional view for illustration of the range of light incident to the light receiving portion of the conventional lower surface through hole type optical device.
Figure 7:
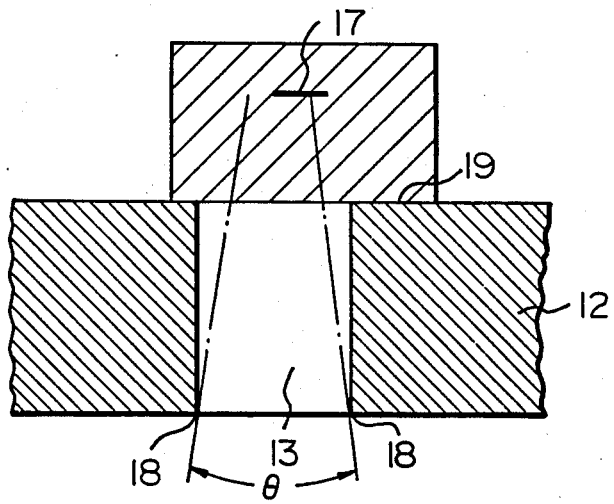
FIG. 7 is an enlarged sectional view for illustration of the range of light incident to the light receiving portion of the conventional lower surface through hole type optical device in the case where the optical device chip is mounted off the predetermined position.
Figure 26:
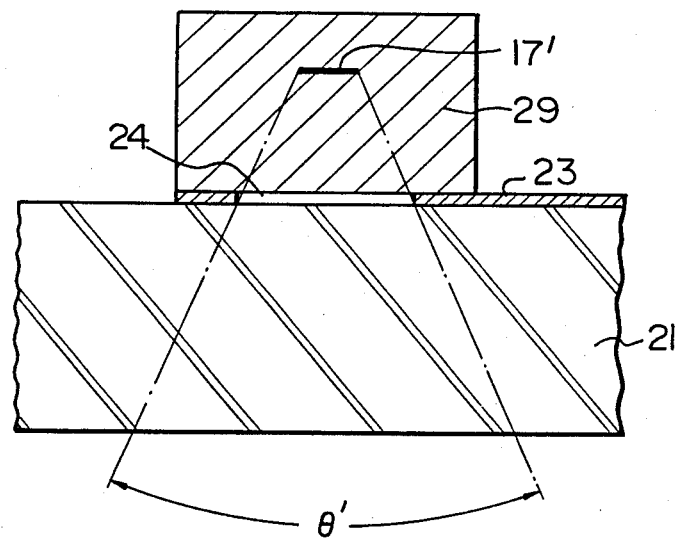
FIG. 26 is a sectional view illustrative of the relationship between the light receiving portion and the opening angle of the optical device chip disposed in the package according to the present invention.

(b) The packaging of this optical device chip is, unlike that of the under surface through hole type shown in FIG. 6, not severely limited in the opening angle. In the structure of the packaging according to the present invention shown in FIG. 26, the light reaching the light receiving portion 17' passes the opening 24 of the pad 23. The opening 24 is in contact with the chip 29 and is very thin. Accordingly, it is possible to let the light included in the wide opening angle θ be incident to the light receiving portion 17'

Then, an embodiment for overcoming the problems in fixing an optical device chip to a die bonding pad, such as overflow of the solder to the light receiving surface and variation in the die bonding strength, will be described in detail. In the present invention, solder is not applied to the substrate side but a solder layer is applied to the chip side.

Figure 27:
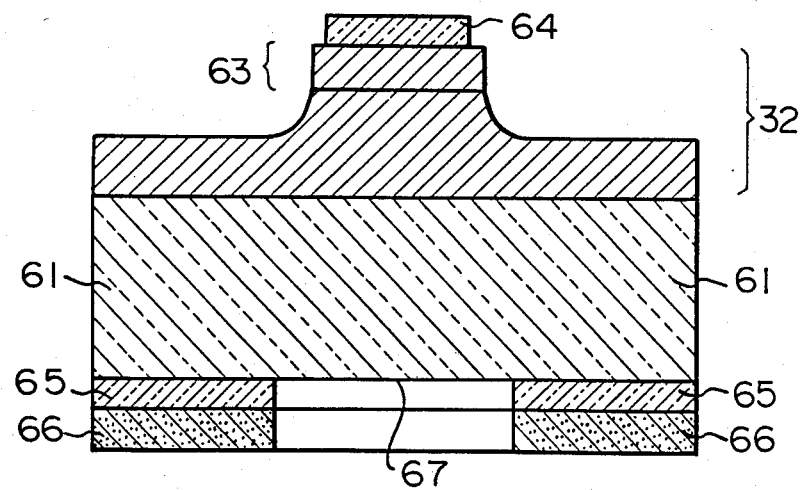
FIG. 27 is a sectional view of an example of a mesa type photodiode according to the present invention.

FIG. 27 is a sectional view showing an example in which the present invention is applied to a mesa type photodiode chip. A non-doped InGaAs epitaxial layer 62 is grown on an Sn-doped InP substrate 61 by liquid phase epitaxial process so as to be lattice-matched to the InP substrate 61. Then, a p-type region 63 is formed by Zn diffusion, whereby a pn junction is produced. Thereafter, a p-side electrode 64 is formed by using AuZn and an n-side electrode 65 is formed by using AuGeNi.

Further, the chip is etched from both sides in the neighborhood of the pn junction into a mesa shape to reduce the electrostatic capacity. Then, an Sn plating pattern is formed on the underside of the n-side electrode 65 using a plating solution of alkanol sulphonic acid. The Sn-plated portion is hereinafter called a solder layer 66 since it functions as solder. The solder layer 66 and the n-side electrode 65 are each in a ring shape, and the underside of the chip is exposed at the central portion which functions as a light receiving surface 67. The thickness of the solder layer 66 is 1-15 μm. These steps are carried out by wafer process. Thereafter, the wafer is scribed and divided into individual chips. The solder layer 66 is formed efficiently by plating or evaporation. Beside Sn, Au-Sn eutectic alloy or Au-Si eutectic alloy may be used as the material of the solder layer 66.

For die-bonding the photodiode chip thus processed using Sn as the solder, the package to be bonded is heated to 250° C. and the chip with the solder layer 66 attached thereto is aligned to the pad and die-bonded thereto. At this time, no other solder is necessary because the solder layer 66 on the underside of the chip is melted temporarily and then solidified to fix them securely.

In experiments, the photodiode chip was die-bonded most satisfactorily when the thickness of Sn plating was 5-10 μm. When the thickness of the Sn plating was 5 μm or less, the bonding strength varied and was unstable. When the thickness of the Sn plating was 10 μm or more, the Sn solder overflowed and varied. Therefore, while the optimum range of the plating thickness depends upon the kind of the solder material, the plating thickness in the range 5-10 μm is generally most satisfactory.

In the present invention, the solder layer is provided on the chip side. The chip is die-bonded to the substrate of the package by the solder layer. The substrate and the package may be arbitrary in the kind of material and the shape.

FIG. 28 is a sectional view showing the structure in which said photodiode chip is mounted to a flat type package using the sapphire substrate 2 of FIGS. 8 and 9 produced through the steps shown in FIGS. 22 to 25. The optical device chip of FIG. 27 is placed directly (without using new solder) on the die bonding pad 23 and die-bonded thereto to securely attach the n-side electrode 65 and the pad 23 thereto. The p-side electrode 64 is wire-bonded to the pad 28 by the wire 30. The light passes the sapphire substrate 21 and the opening 24 of the pad 23, and reaches the light receiving surface 67. In this structure, there is no overflow or dislocation of the solder layer 66.

Figure 17:
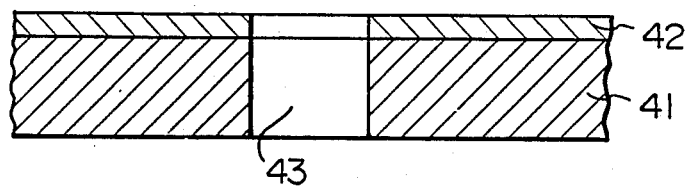
FIG. 17 is a sectional view showing the state in which a bonding pad is formed on a ceramic substrate having a light introducing hole therethrough.
Figure 18:
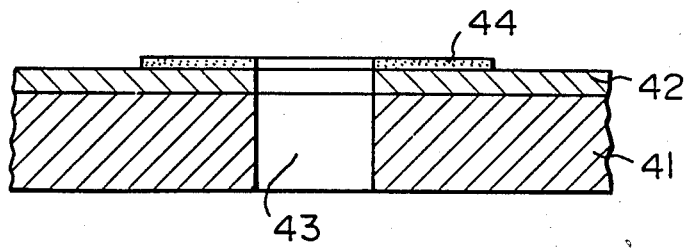
FIG. 18 is a sectional view showing the state in which a ring solder is mounted on the bonding pad of FIG. 17.
Figure 19:
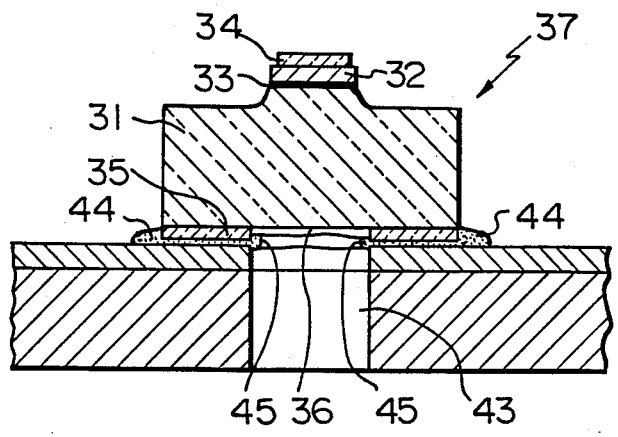
FIG. 19 is a sectional view showing the state in which a photodiode chip is placed on the ring solder of FIG. 18 and soldered thereto.
Figure 20:
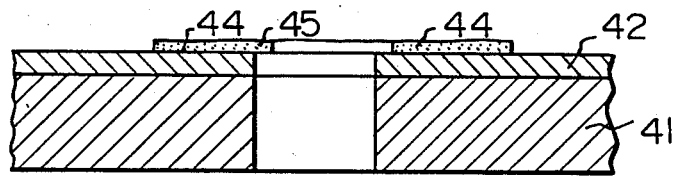
FIG. 20 is a sectional view showing the state in which the ring solder is mounted off the predetermined position on the bonding pad of FIG. 17.
Figure 21:
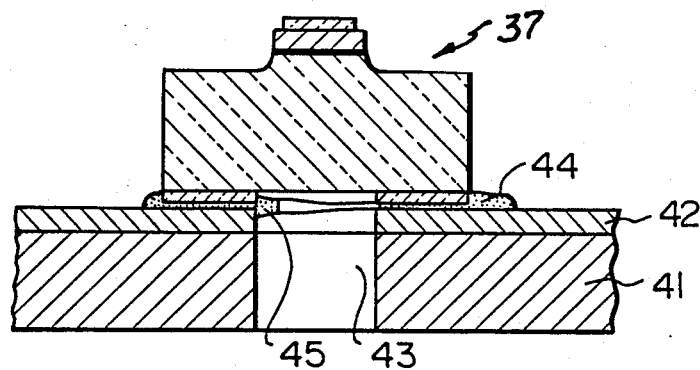
FIG. 21 is a sectional view showing the state in which a photodiode chip is placed on the ring solder of FIG. 20 and soldered thereto.

FIG. 29 is a sectional view showing the structure in which said photodiode chip is mounted to a ceramic substrate type package shown in FIG. 17. Wire bonding, lead and the external shape of the package are not shown because they can be selected arbitrarily. In FIG. 29, the ceramic substrate is not provided with solder, but the solder layer 66 on the chip side functions as the solder to securely attach the chip to the pad 42.

While the present invention has been described hereinabove with reference to the specific applications, it will be understood that the present invention is applicable to any of all optical devices such as planar type photodiode, avalanche photodiode (APD) and further to packaging of plane light transmission type light transmitting diode and plane light transmission type laser diode.

The optical device having the structure according to the present invention as described above provides the meritorious technical effects as follows:

(a) Since overflow or dislocation of the solder layer in die bonding is prevented, there is no reduction in area or space of the transparent portion for passing light by the solder. This increases the yield rate in assembly of the optical devices. When applied to a photodiode, the present invention does not decrease the sensitivity of the photodiode because the photodiode is provided with a metallized layer of such, for example, as Sn in the die bonding area other than the light receiving window. Since the thickness of the metallized layer of such as Sn can be arbitrarily controlled in the accuracy of 0.2 μm, there is no overflow of the solder.

(b) It is not necessary to provide special die-bonding agent such as solder or epoxy resin in die bonding. This makes production process simple and productivity high.

While we have shown and described specific embodiments of our invention, it will be understood that these embodiments are merely for the purpose of illustration and description and that various other forms may be devised within the scope of our invention, as defined in the appended claims.

What is claimed is:

1. A package for an optical device, comprising:
a sapphire substrate having an upper surface which has tapered portions which define tapered edges of a concave deformation in said upper surface; and
a die bonding pad formed on said upper surface of said sapphire substrate by printing and burning electroconductive paste thereon;
said electroconductive plaste being located on said tapered portions but not on said concave deformation thus leaving an opening in said die bonding pad so that light which passes through said sapphire substrate also passes through said opening.

2. A package for an opticla device, as set forth in claim 1, wherein a depth of the concave deformation provided on said sapphire substrate is 5–10 μm.

3. A package as in claim 1 wherein said tapered portions are portions on the substrate which gradually decrease the depth of said substrate to form a concave deformation which is bordered by the tapered portions.

4. An opticla device comprising:
a sapphire substrate having an upper surface witha tapered portion which defines an outer surface of a concave deformation in said upper surface;
a die bonding pad formed on said upper surfacew of said sapphire substrate and on at least a part of said tapered portion; and
an optical device chip die-bonded on said die bonding pad and adapted to interact with light incident from the die-bonding side thereof;
said optical device chip having an electrode and a solder layer sequentially mounted on the die-bonded side thereof, each formed witha hole for passing the light therethrough, and said opticla device chip being die-bonded to said die bonding pad by said solder layer.

* * * * *

UNITED STATES PATENT AND TRADEMARK OFFICE
CERTIFICATE OF CORRECTION

PATENT NO. : 4,663,652

DATED : May 5, 1987

INVENTOR(S) : Hideaki NISHIZAWA

It is certified that error appears in the above-identified patent and that said Letters Patent is hereby corrected as shown below:

In the Drawings, Figure 27, the numeral "32" should be --62--.

Signed and Sealed this

Twelfth Day of January, 1988

*Attest:*

DONALD J. QUIGG

*Attesting Officer*   *Commissioner of Patents and Trademarks*